United States Patent [19]

Forrat

[11] 4,053,326
[45] Oct. 11, 1977

[54] PHOTOVOLTAIC CELL

[75] Inventor: Francis Forrat, Grenoble, France

[73] Assignee: Commissariat a l'Energie Atomique, Paris, France

[21] Appl. No.: 599,435

[22] Filed: July 28, 1975

[30] Foreign Application Priority Data

July 31, 1974 France .............................. 74.26521

[51] Int. Cl.² .......................................... H01L 31/06
[52] U.S. Cl. ............................ 136/89 CC; 136/89 P;
136/89 H; 136/89 SG; 136/89 TF; 148/175
[58] Field of Search ............................................ 136/89

[56] References Cited
U.S. PATENT DOCUMENTS

| 3,151,378 | 10/1964 | Finn, Jr. ................................. | 29/25.3 |
| 3,772,768 | 11/1973 | Fischer et al. ........................ | 29/572 |
| 3,833,425 | 9/1974 | Leinkram et al. ..................... | 136/89 |
| 3,914,856 | 10/1975 | Fang ..................................... | 29/572 |

OTHER PUBLICATIONS

F. Daniels, "Direct Use of the Son's Energy," Yale University Press, New Haven, 1964, pp. 286–298.
T. L. Chu et al, "Silicon Films on Steel Substrates," J. Electrochem. Soc. vol. 121, p. 87c, Abstract No. 22, Mar. 1974.

Primary Examiner—John H. Mack
Assistant Examiner—Aaron Weisstuch
Attorney, Agent, or Firm—Sughrue, Rothwell, Mion, Zinn and Macpeak

[57] ABSTRACT

A photovoltaic cell includes a metal support which is coated with a metal having a low melting point on which a crystalline layer of a semiconductive material is deposited, the material being doped to form a p-n semiconductor. In preferred embodiments the metal support may be a cell plate, the metal having a low melting point may be tin, and the semiconductive material may be silicon.

According to the method of manufacturing the cell a gaseous compound containing a material adapted to form the semiconductive crystalline layer is decomposed in a chamber containing a metal support coated with a metal having a low melting point, the temperature of the metal having a low melting point is then raised to a value such that the metal is in a liquid state and forms a liquid metal substrate on which the crystalline layer forms by epitaxy, and finally the gaseous compound is suitably doped so that the semiconductive layer has a p-n type structure.

5 Claims, 4 Drawing Figures

PHOTOVOLTAIC CELL

BACKGROUND OF THE INVENTION

1. Field of the Invention

The invention relates to a photovoltaic cell and a method of manufacturing it.

2. DESCRIPTION OF THE PRIOR ART

Some known photovoltaic cells are made from silicon discs or tape, or from a metal substrate on which a silicon film is deposited. Advantageously, in the latter case, a steel substrate is used, but precautions then have to be taken to obtain silicon having large monocrystalline grains (for obtaining high conversion yields) and to prevent the silicon from being doped by the substrate during the manufacture of the photovoltaic cell.

SUMMARY OF THE INVENTION

To this end, according to the invention, use is made of a metal plate coated with a metal having a low melting point, to form the metal support on which the semi-conductive layer is deposited.

According to the invention there is provided a photovoltaic cell, which comprises a metal support coated with a metal having a low melting point on which a crystalline layer of a semiconductive material is deposited, the material being doped to form a p-n junction.

DETAILED DESCRIPTION OF THE INVENTION

Advantageously the metal support is a steel or iron-silicon or iron-nickel plate. The metal having a low melting point is advantageously tin or tin alloy, e.g. tin alloyed with lead. The thickness of the tin layer is preferably less than 5 $\mu$. The semiconductive material is preferably silicon.

In addition to its advantageous performance, the structure according to the invention is adapted for a method of manufacture which is very simple and whereby large, high-quality cyrstalline films can be produced in an inexpensive manner. This result is obtained by using the metal having a low melting point which covers the metal support and which, during the manufacture of the cell, is raised to a temperature such that it is in a liquid state, whereupon the crystal grows by epitaxy on the liquid metal.

More specifically, the invention also provides a method of manufacturing the aforementioned photovoltaic cell, which comprises decomposing a gaseous compound containing a material adapted to form a semiconductive crystalline layer in a chamber containing a metal support coated with a metal having a low melting point, raising the temperature of the metal having a low melting point to a value such that the metal is in a liquid state and forms a liquid metal substrate on which the crystalline layer forms by epitaxy, and suitably doping the gaseous compound doped so that the semiconductive layer has a p-n type structure.

Decomposition can be by heating or by a plasma produced by a high-frequency field.

In a preferred embodiment, the steel plate forming a metal support has a Curie point in the highest temperature range reached during the process, so that the heating can be regulated by high-frequency induction.

By way of illustration, the material forming the crystal can be e.g. silicon and the compound undergoing thermal decomposition can be silane $SiH_4$ or chlorosilane.

The features and advantages of the photovoltaic cell according to the invention and the method of manufacturing it will be clearer from the following description of embodiments given by way of example, with reference to the accompanying drawings.

Figure 1:
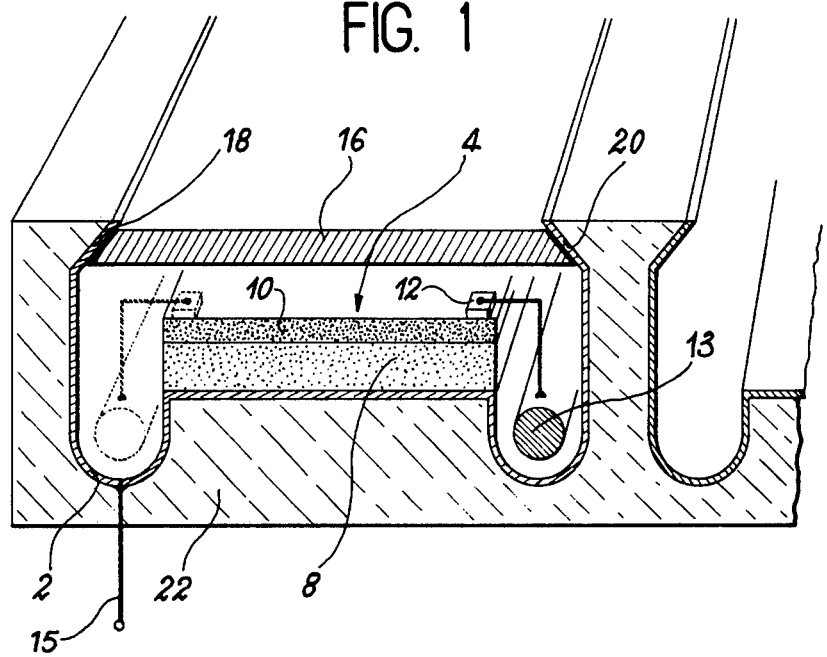
FIG. 1 is a diagrammatic cross-section of the photovoltaic cell according to the invention.

Turning now to FIG. 1, FIG. 1 shows a photovoltaic cell comprising a tin-plated steel plate 2, the central part of which bears a semiconductive layer 4 comprising e.g. a $p$ silicon layer 8 and an $n$ silicon layer 10. On the top surface, connections 12 are connected to a collector 13 connected to an external connection (not shown); the other connection 15 which has the opposite polarity from connection 12, is connected to plate 2. The photovoltaic cell according to the invention can be closed at its top by a glass plate 16 brazed to the plate at its ends 18 and 20. An insulating support 22 completes the assembly.

The tin deposited on the steel support is adapted to facilitate the crystalline growth of silicon during manufacture and to produce a chemical barrier against iron atoms from the sheet, to prevent too much silicon dissolving in the iron, to anchor the silicon film on the steel sheet and to match the thermal expansion of silicon and iron. In addition, the tin can be used to braze the glass plate to the steel plate.

Advantageously, the steel plate can have a textured structure obtained e.g. by heat-treatment (orientation 110 or 100). The steel plate can be tin-plated either by electrolysis or by liquation; the electrolysis operation can be followed by heattreatment at e.g. approximately 800° C under hydrogen, thus facilitating adhesion between the tin and the support.

The plate can be made of iron-silicon steel and be e.g. a few tenths of a millimeter thick.

By way of example, a photovoltaic cell according to the invention can deliver a current of 10 $mA/cm^2$ at a voltage of 500 mV in normal sunlight (approximately 1 $kW/m^2$).

Figure 2:
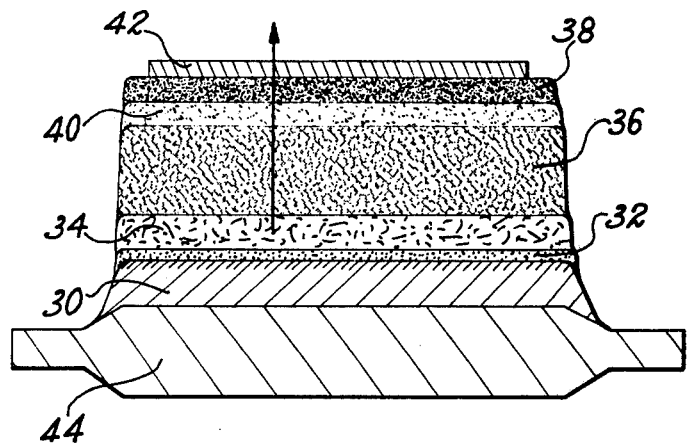
FIG. 2 is a more detailed cross-section of the structure of the semiconductive layer and the metal substrate.

FIG. 2 is a diagram of the structure of the semiconductive layer deposited on the metal support. For the sake of illustration the dimensions are not, of course, to scale. A metal surface 30 having a low melting point is e.g. a film of tin or tin-based alloy. During manufacture, as will be seen more clearly hereinafter, the surface is liquid but during normal operating conditions it is solid. Layer 30 is covered with a layer 32 of $p+$ doped silicon and then in succession with a $p+$ doped layer 34, a $p$ silicon layer 36, and an $n+$ type layer 38. The juxtaposition of p-type layer 36 and n-type layer 38 results in a $pn$ junction (reference numeral 40).

Of course, without departing from the invention, the signs of the doping operations can be inverted, in which case layers 32, 34 and 36 will have $n$ and $n+$ doping. The entire structure is covered by a transparent metal comb- or grid-shaped electrode 42, made e.g. of aluminum having a thickness from 2 to 2000 A.

Figure 3:
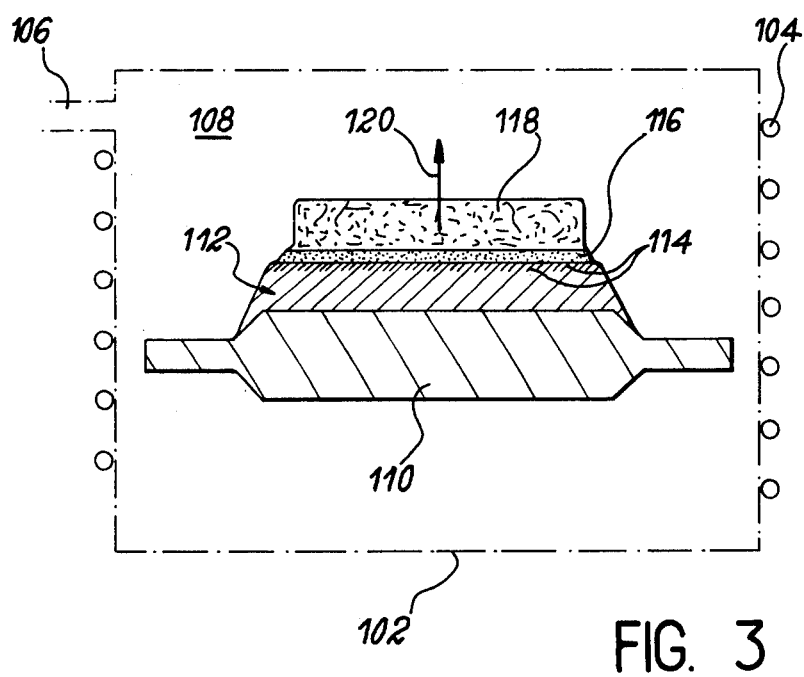
FIG. 3 diagrammatically illustrates the process of manufacturing the photovoltaic cell.

FIG. 3 diagrammatically illustrates the method of manufacturing the aforementioned photovoltaic cell. In FIG. 3, a chamber 102 is provided with heating means 104 and an inlet 106 for injecting a gaseous compound into chamber 108, the compound containing the substance to be deposited. A support 110 surmounted by a metal substrate 112 is disposed in the chamber. The temperature of substrate 112 is raised by heating means 104 to a temperature such that the gaseous compound in space 108 is decomposed by heating, producing a material for forming the crystal, and such that the metal substrate 112 is liquefied at least on its surface. After becoming liquid, substrate 112 produces nuclei 114 at its surface, resulting in the formation of a thin layer 116 which in turn forms a nucleus on which crystal 118 can grow by epitaxy in direction 120.

If the crystal-forming material is silicon, the thin layer 116 comprises a compact hexagonal arrangement, in the case of non-textured steel. As soon as the silicon atoms are deposited, they gather around the first deposited atoms. As soon as the first layer is deposited on the liquid metal, growth occurs by conventional epitaxy on the base assembly. In order to increase the crystal deposition rate, the operating temperature can be increased above the decomposition point of silane.

The silicon crystal can be doped by mixing the silane with doping agents such as boron, to obtain type $p+$ or $p$ doping ($p+$ doping corresponds to a concentration of about $10^{16}$ atoms of doping agent per cm$^3$, and type $p$ doping to about $10^{15}$ atoms/cm$^3$). To obtain type $n$ doping, the silane can be mixed with phosphorus.

Figure 4:
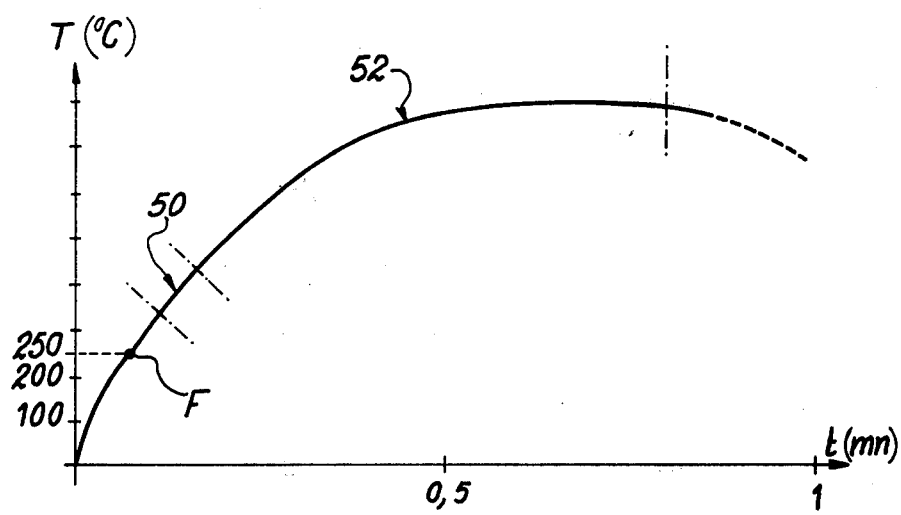
FIG. 4 is a temperature-time graph showing an example of the method of manufacturing the photovoltaic cell.

Advantageously the metal support is a liquid film of a metal having a Curie point corresponding to the highest temperature range in the method of operation, so as to ensure automatic control. For example, the metal support can be made of a steel sheet having a Curie point between 600° and 1000° C. In this case the temperature-time diagram characterizing the thermal program imposed on the system can be of the kind illustrated in FIG. 4, where the time is shown as the abscissa and the temperature as the ordinate.

First, the temperature is raised to a point F where the metal forming substrate 30 melts. The temperature continues to increase to a range 50 where the layer forming the nucleus 32 is deposited. Beyond this range, crystal formation and growth by epitaxy is observed in the entire region 52, possibly accompanied by the formation of doped Si $p+$, $p$ and $n$ regions. When the last Si $n$ layer has been deposited, the temperature of the layer of liquid tin is lowered to about 232° C, to prevent stress on the silicon. The duration of the process can be e.g. of the order of 10 minutes.

The method can be used to obtain high-quality silicon; it does not dislocate the crystal during the manufacture of the entire structure, which is manufactured entirely "in situ"; the method of manufacture is economic; and large continuously-moving surfaces can be processed without using control devices.

For example, the aforementioned method can be used to produce photovoltaic cells measuring 2 × 500 cm and adapted to form solar batteries, the cells being mounted in parallel groups on insulating panels. The following operations are performed, starting from a commercial 3/10 10-plated iron tape comprising 2 $\mu$ tin:

1. embossing;
2. chemical scouring with zinc chloride $ZnCl_2$; and
3. insertion into an epitaxy furnace.

These three operations are performed on a conveying machine.

The power of the generator is increased until the temperature is reached and stabilized to ± 1° C over the entire sheet being processed (for about 10 minutes). Next, the desired structure is formed by conventional epitaxy. Next, the heating power is reduced to ensure abundant seeding of tin, so as to ensure adhesion. Next the following operations are performed:

4. transfer to a masking chamber;
5. deposition of the collector by a conventional method; and
6. coating.

Of course, the compound can be decomposed by a plasma produced in a gas at a pressure between e.g. 1 and 100 Torr, using a high-frequency field having a frequency between e.g. kHz and MHz. The metal substrate can be heated by HF induction or conduction.

I claim:

1. A photovoltaic cell comprising a steel plate having a textured structure coated with tin and a crystalline layer of a semiconductive material deposited thereon with the semiconductive material being doped to form a p-n junction, said photovoltaic cell being produced by decomposing a gaseous compound containing a material which forms the semiconductive crystalline layer in a chamber containing said steel plate having a textured surface coated with the tin, wherein the temperature of the tin is raised to a temperature such that the tin is in the liquid state and forms a liquid tin substrate on which the crystalline layer forms by epitaxy, and wherein the gaseous compound is suitably doped so that the semiconductive layer has the p-n structure.

2. A photovoltaic cell comprising a steel, iron-silicon or iron-nickel support coated with tin or a tin alloy and a crystalline layer of a semiconductive layer deposited thereon with the semiconductive material being doped to form a p-n junction, said photovoltaic cell being produced by decomposing a gaseous compound containing a material which forms the semiconductive crystalline layer in a chamber containing said metal support coated with the tin or tin alloy, wherein the temperature of the tin or tin alloy is raised to a temperature such that the tin or tin alloy is in the liquid state and forms a tin or tin alloy metal substrate on which the crystalline layer forms by epitaxy, and wherein the gaseous compound is suitably doped so that the semiconductive layer has the p-n structure, the melting point of said tin or tin alloy being such that during said decomposing the tin or tin alloy will melt into the liquid state and crystalline growth will be by epitaxy thereon.

3. The photovoltaic cell according to claim 2, wherein said tin alloy is a tin-lead alloy.

4. The photovoltaic cell according to claim 2, wherein said semiconductive material is silicon.

5. A photovoltaic cell comprising a steel support coated with tin and a crystalline layer of silicon deposited on said tin-coated steel support with the silicon being doped to form a p-n junction.

* * * * *